United States Patent [19]

Fusaroli

[11] Patent Number: 4,947,237
[45] Date of Patent: Aug. 7, 1990

[54] LEAD FRAME ASSEMBLY FOR INTEGRATED CIRCUITS HAVING IMPROVED HEAT SINKING CAPABILITIES AND METHOD

[75] Inventor: Marzio Fusaroli, Milan, Italy

[73] Assignee: SGS Thomson Microelectronics, srl, Italy

[21] Appl. No.: 106,016

[22] Filed: Oct. 1, 1987

Related U.S. Application Data

[63] Continuation of Ser. No. 809,505, Dec. 16, 1985, abandoned.

[30] Foreign Application Priority Data

Dec. 18, 1984 [IT] Italy .............................. 241125 A/84

[51] Int. Cl.$^5$ ............................................ H01L 23/48
[52] U.S. Cl. ........................................ 357/70; 357/72; 357/81
[58] Field of Search ............................. 357/70, 72, 81

[56] References Cited

U.S. PATENT DOCUMENTS

| | | |
|---|---|---|
| 4,066,839 | 1/1978 | Cossutta et al. ...................... 357/70 |
| 4,141,029 | 2/1979 | Dromsky ............................. 357/70 |
| 4,527,185 | 7/1985 | Philofsky et al. ..................... 357/70 |

Primary Examiner—Edward J. Wojciechowicz
Attorney, Agent, or Firm—Harry M. Weiss

[57] ABSTRACT

An integrated circuit package is described that provides increased heat dissipation of heat generated in an integrated circuit chip that can be positioned within the package. This increased heat dissipation characteristic is achieved by configuring enlarged metal areas of the lead frame of the package that are extensions of the flag area. The flag area is the portion of the lead frame to which the integrated circuit chip is mounted in the assembly of the semiconductor package. The increased lead frame area provides increased contact with the package housing and provides a thermal conduction path in close proximity to the exterior surface of the package housing. The integrated circuit chip has a more efficient thermal path to the ambient air thermal heat sink.

4 Claims, 1 Drawing Sheet

LEAD FRAME ASSEMBLY FOR INTEGRATED CIRCUITS HAVING IMPROVED HEAT SINKING CAPABILITIES AND METHOD

This is a continuation of co-pending application Ser. No. 809,505 filed on Dec. 16, 1985, now abandoned.

BACKGROUND OF THE INVENTION

1. Field of the Invention

This invention relates generally to the packaging of integrated circuit chips and more particularly to lead frame structures for integrated circuit chips, having improved heat dissipation.

2. Discussion of the Related Art

As the density of elements formed on a substrate of an integrated circuit configuration has increased, the problem of dissipation of heat generated therefrom has become increasingly important. If heat is not dissipated, the resulting rise in temperature of the entire integrated circuit and package can have a deleterious effect on the operating characteristics of the integrated circuit. Heat sinks can be thermally coupled to semiconductor component packages to assist in the removal of the heat. However, the integrated circuit package is typically a poor thermal conductor, so this technique has been of limited value. Other techniques for attempting to cool the chip by heat sinking have included adding a cooling plate in contact with the integrated circuit. However, the cooling plate, an effective solution to the heat dissipation, results in problems that involve the use of special circuit boards to accomodate the presence of the cooling plate.

Therefore, a need exists for an improved cooling technique that can be implemented using the present packaging methods and would result in improved heat dissipation through the integrated circuit package without special adapting devices in the electronic circuit.

SUMMARY

It is therefore an object of the present invention to provide an improved lead frame structure for dissipating heat generated in an integrated circuit chip.

It is another object of the present invention to provide an improved heat dissipating structure for conducting heat generated in an integrated circuit chip that can be implemented with current packaging techniques.

It is still another object of the present invention to provide improved thermal conduction between an integrated circuit chip and the lead frame assembly to which the chip is mounted.

Yet another object of the present invention is to provide a method for improving the thermal conduction connection between an integrated circuit chip and package to which the chip is mounted.

The aforementioned and other objects are accomplished, according to the present invention, by providing a lead frame geometry having additional thermal mass for increasing the thermal inertia while providing additional thermal paths for conduction of heat away from the integrated circuit chip.

DESCRIPTION OF THE EMBODIMENTS

In accordance with one embodiment of the present invention, a package for semiconductor circuits is disclosed. The semiconductor package includes a semiconductor chip, a lead frame having regions for electrical coupling to the semiconductor chip, the lead frame including a flag region and an enlarged associated area mechanically coupled to the semiconductor chip and a housing package for enclosing the lead frame.

In accordance with another embodiment of the present invention, an integrated circuit package is described that includes an integrated circuit chip, a lead frame mechanically and electrically coupled to the integrated circuit chip, and a housing enclosing the integrated circuit chip and preselected portions of the lead frame, wherein the lead frame has an expanded area, the expanded area being coupled to a portion of the lead frame in contact with the chip.

In accordance with yet another embodiment of the present invention, a method is disclosed for increasing the cooling of an integrated circuit chip in a package housing comprising the step of enlarging an area of a lead frame coupled to said integrated circuit chip. The package for semiconductor circuits comprises a semiconductor chip, a lead frame having regions electrically coupled thereto, and selected portions of the lead frame wherein interior portions of the lead frame coupled to the semiconductor chip have increased areas.

These and other features of the invention will be understood by reading the following description along with the figures.

OPERATION OF THE PREFERRED EMBODIMENT

Detailed Description of the Figures

Figures 1, 2A:
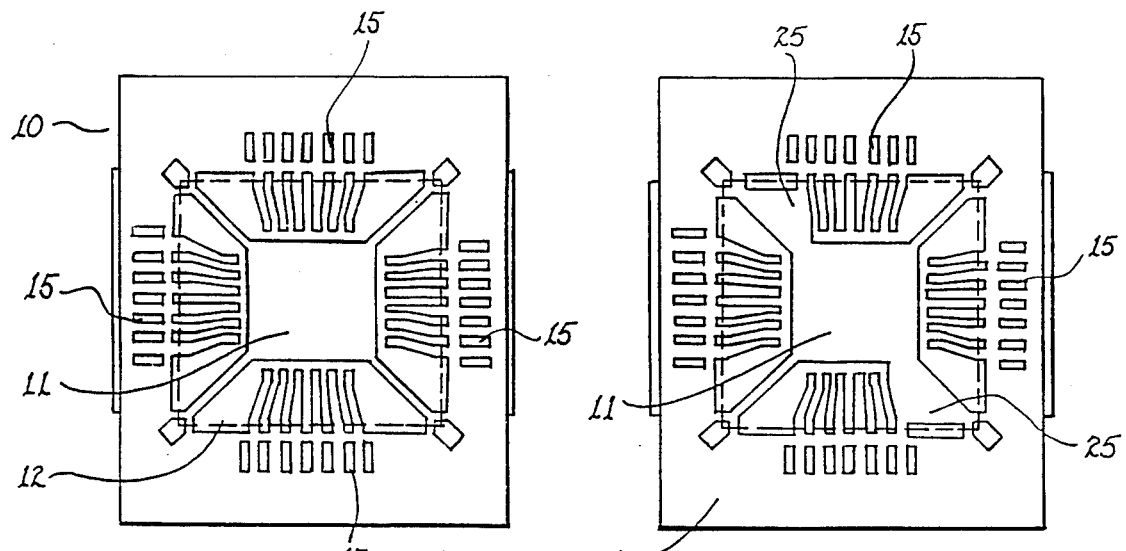
FIG. 1 is a top view of a typical lead frame geometry.
FIGS. 2a, 2b and 2c are top views of examples of lead frame geometry for improved semiconductor chip heat dissipation according to the instant invention.
Figures 2B, 2C:
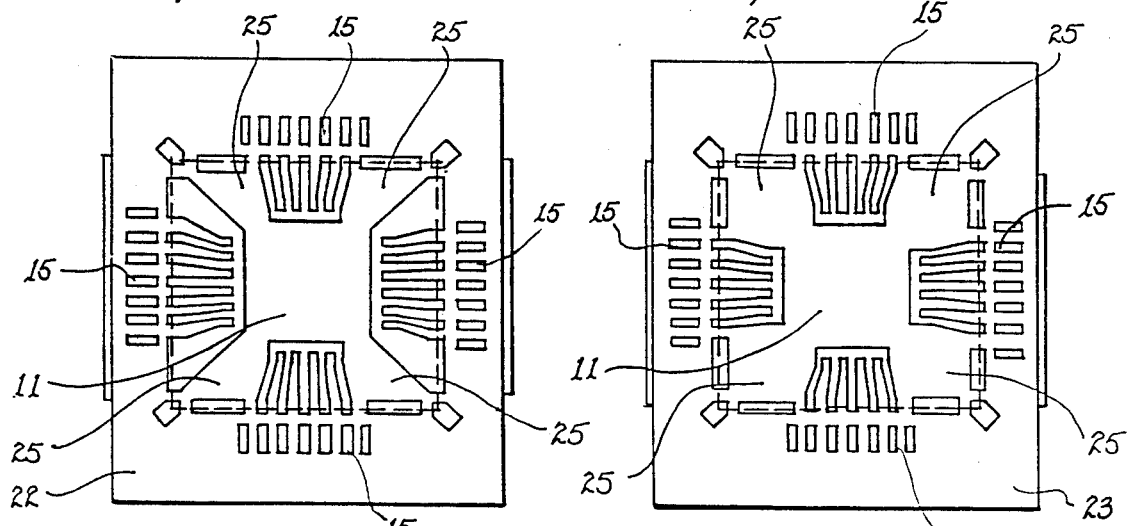

Referring to FIG. 1, FIG. 2a, FIG. 2b and FIG. 2c, a plurality of lead frame configurations 10, 20, 22 and 23 are shown. Section 11 of each configuration is made of suitable metal and is usually silverplated and is referred to as the flag area of the lead frame. Isolated from but surounding the metallic region or flag area 11 about the four sides thereof are a plurality of leads 15. In assembly, an integrated circuit chip is bounded or mounted to flag area 11, as is understood, with leads 15 being electrically connected to the chip by wire bonding, for example. Dotted line 12 indicates the general area that the package housing occupies. The interior of the region indicated by the dotted lines can be filled with a plastic or resin material that will serve as structural support for the elements of the package, including the wires coupling the integrated chip and the conducting leads 15 of the lead frame. A cap encloses the housing to environmentally seal the package. In FIGS. 2a, 2b and 2c, areas 25 indicate regions that normally do not include a significant amount of lead frame structure.

Figure 3:
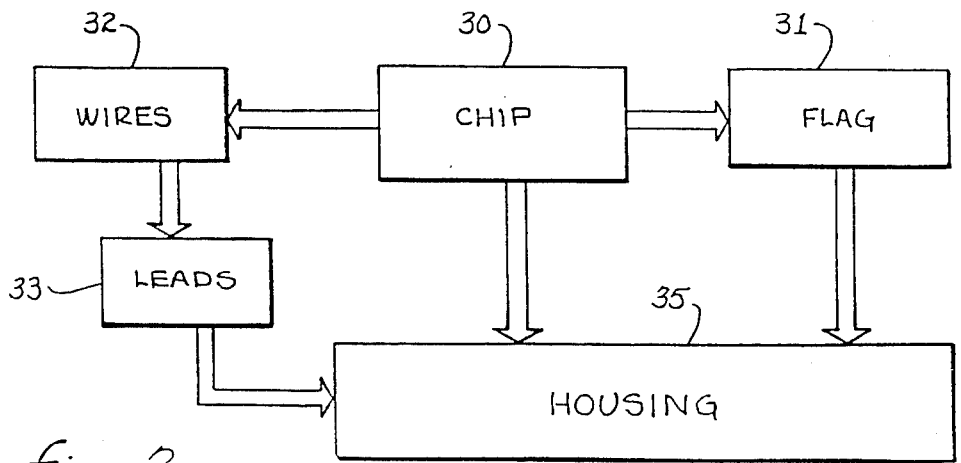
FIG. 3 is a diagram of the flow of heat between the integrated circuit chip and the housing package.

Referring now to FIG. 3, the flow of heat from the integrated circuit chip to the exterior of the package housing is shown schematically. Integrated circuit chip 30 is the source of the heat. The chip 30 is seated on flag 11 and through flag 31 transfers heat to the package housing 35. In addition, heat from chip 30 is transferred directly to the package housing 35. Heat can also be transferred via wires 32 to leads 33 and to package housing 35.

DESCRIPTION OF THE PREFERRED EMBODIMENT

The heat generated by the semiconductor chip can be conducted to the exterior surface of the package housing by a plurality of paths. The increased areas 25 of the lead frame coupled to the flag area 11 can assist in flow of heat to this surface. First, the added mass provides for temperature inertia. Next, the lead frame, being fabricated of a relative good thermal conductor, provides an increased area for contact with the housing package permitting a more uniform transfer of heat. Finally, the enlarged conducting areas of the lead frame are relatively close to the surface of the package housing. In typical electronic circuits employing integrated circuit packages, the typical heat sink is the air surrounding the package. The package, being comprised of a relatively poor thermal conductor can provide better cooling of the interior integrated chip when the heat can be distribured in close proximity to the package exterior.

Referring once again to FIG. 3, the increased area of the lead frames enlarges the thermal path from the chip 30 to the flag 31 and to the housing.

As shown in FIG. 2a, the lead frame 20 comprises two enlarged metal areas 25 that are joined in opposite corners of the lead frame. Similarly, lead frame 22 has four enlarged metal corner areas 25 mechanically and thermally connected to flag area 11. These enlarged corner metal areas 25 increase the heat dissipating characteristics of flage area 11 to which the semiconductor integrated circuit chip is mounted.

It will be clear by reference to FIG. 2c that the increased heat dissipation provided by the enlarged thermal conducting areas 25 of the lead frame 23 is obtained at the expense of fewer leads to the external circuit board.

This description is meant to describe the preferred embodiment and is not meant to limit the scope of the invention. The scope of the invention is to be limited only by the following claims. Many variations will be apparent to one skilled in the art that would yet be encompassed by the spirit and scope of the invention.

What is claimed is:

1. A semiconductor integrated circuit package including a package housing partially enclosing a lead frame having leads extending from four sides of said package housing, comprising, in combination:

central flag means in said lead frame for supporting a semiconductor chip, said flag means having four corners, said a package housing enclosing said central flag means of said lead frame, said package housing having four corners; and heat spreading means in said lead frame for conducting heat from said semiconductor chip, said heat spreading means being integral with said central flag means and extending from at least one of said four corners of said central flag means towards one of said four corners of said package housing and extending out of said package housing on two adjacent sides of said package housing, said heat spreading means increasing in width with distance from said central flag means.

2. The semiconductor integrated circuit package according to claim 1 wherein said heat spreading means extends from each of said four corners of said central flag means towards a respective corner of said package housing.

3. The semiconductor integrated circuit package according to claim 1 wherein said heat spreading means extends out of said package housing in two places on a single side of said package housing.

4. The semiconductor integrated circuit package according to claim 2 wherein said heat spreading means extends out of said package housing in two places on a single side of said package housing.

* * * * *